(12) United States Patent
Rashid (10) Patent No.: US 7,230,464 B2
(45) Date of Patent: Jun. 12, 2007

(54) CLOSED-LOOP DELAY COMPENSATION FOR DRIVER

(75) Inventor: Mamun Ur Rashid, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 10/880,983

(22) Filed: Jun. 29, 2004

(65) Prior Publication Data

US 2005/0285642 A1 Dec. 29, 2005

(51) Int. Cl.
*H03K 3/017* (2006.01)
(52) U.S. Cl. .................................... 327/175; 327/158
(58) Field of Classification Search ................ 327/158, 327/159, 160, 161; 326/172–175
See application file for complete search history.

(56) References Cited

U.S. PATENT DOCUMENTS

| 5,572,158 | A  | * | 11/1996  | Lee et al. ................... 327/175 |
| 5,790,611 | A  | * | 8/1998   | Huang et al. ............... 375/371  |
| 6,181,178 | B1 | * | 1/2001   | Choi ........................... 327/175 |
| 6,448,828 | B2 | * | 9/2002   | Stark et al. ................. 327/175 |
| 6,525,581 | B1 | * | 2/2003   | Choi ........................... 327/175 |
| 6,677,792 | B2 | * | 1/2004   | Kwak .......................... 327/158 |
| 6,791,360 | B2 | * | 9/2004   | Gauthier et al. .............. 326/93 |
| 6,853,225 | B2 | * | 2/2005   | Lee ............................. 327/158 |
| 6,934,215 | B2 | * | 8/2005   | Chung et al. ............... 365/233  |
| 6,943,604 | B2 | * | 9/2005   | Minzoni ...................... 327/175 |
| 6,956,418 | B2 | * | 10/2005  | Kwak et al. ................. 327/158 |
| 6,960,952 | B2 | * | 11/2005  | Nguyen et al. ............. 327/175 |
| 6,963,235 | B2 | * | 11/2005  | Lee ............................. 327/158 |

* cited by examiner

*Primary Examiner*—Timothy P. Callahan
*Assistant Examiner*—Hai L. Nguyen
(74) *Attorney, Agent, or Firm*—Schwegman, Lundberg, Woessner & Kluth, P.A.

(57) ABSTRACT

A device includes a number of output circuits to drive a number of output signals. The output signals have timing relationship among each other. The device also includes a control loop circuit serving as a feedback loop to adjust any mismatch between the timing relationships of the output signals.

28 Claims, 8 Drawing Sheets

CLOSED-LOOP DELAY COMPENSATION FOR DRIVER

FIELD

Embodiments of the present invention relate to drivers in electrical devices.

BACKGROUND

Electrical devices such as processors, memory controllers, and graphics controllers reside in many computers and electronic systems. A typical electrical device has drivers to drive signals from one device to another device.

Some devices are designed with drivers to provide output signals in which the output signals have expected timing relationships with a clock signal. For example, the output signals may have an expected timing for the rising edges relative to the clock signal, and an expected timing for the falling edges relative to the clock signal.

Variations in manufacturing process and other factors may cause the timing of the rising and falling edges to be different from the expected timing, thereby limiting the speed of the device.

DESCRIPTION OF EMBODIMENTS

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the claims and all available equivalents.

Figure 1:
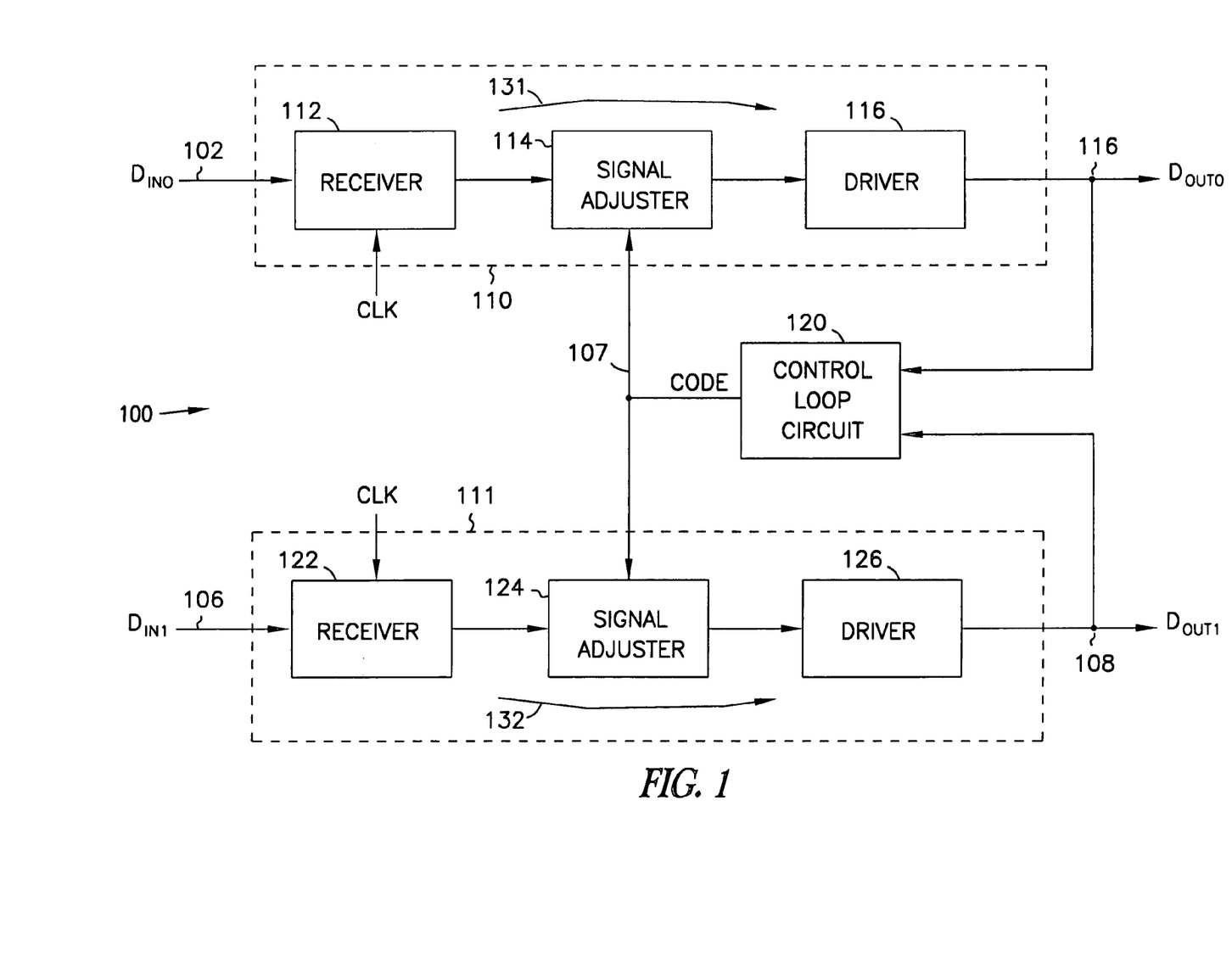
FIG. 1 shows an apparatus having a control loop circuit according to embodiments of the invention.

FIG. 1 shows an apparatus having output circuit and a control loop circuit according to embodiments of the invention. Apparatus 100 includes output circuits 110 and 111 and a control loop circuit 120. Output circuit 110 receives an input signal $D_{IN0}$ at an input node 102 and outputs a pad output signal $D_{OUT0}$ at an output node 104. Output circuit 111 receives an input signal $D_{IN1}$ at an input node 106 and outputs a pad output signal $D_{OUT1}$ at an output node 108. Control loop circuit 120 connects to both output circuits 110 and 111 and serves as a feedback loop to control the timing of the $D_{OUT0}$ and $D_{OUT1}$ signals.

Output circuit 110 includes a receiver 112, a signal adjuster 114, and a driver 116. Receiver 112 receives the $D_{IN0}$ signal using a clock signal CLK as a timing signal. Signal adjuster 114 adjusts the signal on signal path 131 based on a control code (CODE) on line 107. Driver 114 drives the $D_{OUT0}$ signal.

Output circuit 111 includes receiver 122, a signal adjuster 124, and a driver 126. Receiver 122 receives the $D_{IN1}$ signal using the CLK signal as a timing signal. Signal adjuster 124 adjusts the signal on signal path 132 based on the same CODE on lines 107. Driver 126 drives the $D_{OUT1}$ signal.

Control loop circuit 120 monitors the $D_{OUT0}$ and $D_{OUT1}$ signal to control the CODE to adjust the timing of the $D_{OUT0}$ and $D_{OUT1}$ signals. In some embodiments, the CODE is a combination of multiple binary bits presented by a number of different signals on lines 107.

The CODE may have an initial value such that output circuits 110 and 111 output the $D_{OUT0}$ and $D_{OUT1}$ signals with timing according to an expected timing. However, variations in factors such as manufacturing process, voltage supply, and operating temperature may cause the $D_{OUT0}$ and $D_{OUT1}$ signals to have timing different from the expected timing. Control loop circuit 120 controls the CODE to cause output circuits 110 and 111 to adjust the timing of the signals on signal paths 131 and 132 so that the timing of the $D_{OUT0}$ and $D_{OUT1}$ signals match the expected timing.

Each value of the CODE causes signal adjuster 114 to make a different adjustment to the signal on signal path 131, which is also the signal path of the $D_{IN0}$ signal between receiver 112 and driver 116. As a result of the adjustment by signal adjuster 114, the timing of the $D_{OUT0}$ signal is adjusted. In some embodiments, signal adjuster 114 is a signal duty cycle adjuster, which adjusts the duty cycle of the $D_{IN0}$ signal on signal path 131 to affect the duty cycle of the $D_{OUT0}$ signal.

Each value of the CODE also causes signal adjuster 124 to make a different adjustment to the signal on signal path 132, which is also the signal path of the $D_{IN1}$ signal between receiver 122 and driver 126. As a result of the adjustment by signal adjuster 124, the timing of the $D_{OUT1}$ signal is adjusted. In some embodiments, signal adjuster 124 is a signal duty cycle adjuster, which adjusts the duty cycle of the $D_{IN1}$ signal on signal path 132 to affect the duty cycle of the $D_{OUT1}$ signal.

In some embodiments, signal adjusters 114 and 124 adjust the duty cycle of the $D_{IN0}$ and $D_{IN1}$ signals on signal path 131 and 132 by adjusting one edge of the signal while keeping the other edge of the signal fixed. In some embodiments, the CODE includes a combination of a delay code and a direction code. The value of delay code may correspond to an amount of delay applied to the edge of the signal being adjusted. The value of the direction code indicates which one of the edges (rising or falling) of the signal is being adjusted.

Figure 2:
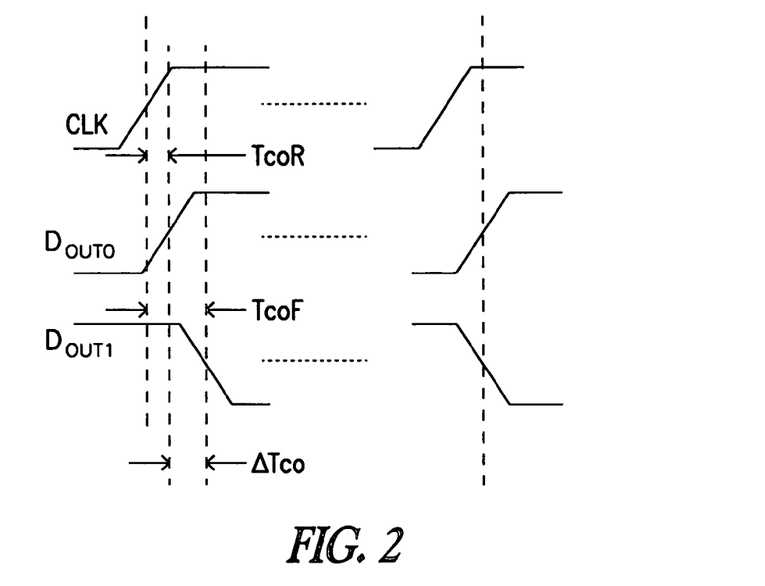
FIG. 2 is an exemplary timing diagram for FIG. 1.

FIG. 2 is an exemplary timing diagram showing timing relationships among various signals of FIG. 1. In FIG. 2, TcoR is a delay between the rising edge of the CLK signal and the rising edge of the $D_{OUT0}$ signal relative to a reference time T0. TcoF is a delay between the falling edge of the CLK signal and the falling edge of the $D_{OUT1}$ signal relative to the reference time T0. In this specification, TcoR or TcoF is referred to as a clock-to-pad delay. FIG. 2 uses the rising edge of the CLK signal as a reference edge to show TcoR and TcoF. However, the falling edge of the CLK signal may be used as a reference edge to show TcoR and TcoF.

FIG. 2 shows a situation when TcoR and TcoF are unequal or mismatched. ΔTco (delta Tco) is the difference between TcoR and TcoF. When the mismatch exists (delta Tco exists), control loop circuit 120 of FIG. 1 adjusts the value of the CODE to reduce or eliminate delta Tco. In some embodiments, control loop circuit 120 may change the value of the CODE to a number of different values until delta Tco is reduced to an appropriate value or until delta Tco is eliminated. For example, between times T0 and T1 in FIG. 2, control loop circuit 120 may repeatedly change the value of the CODE to different values until delta Tco is zero or eliminated at time T1.

Figure 3:
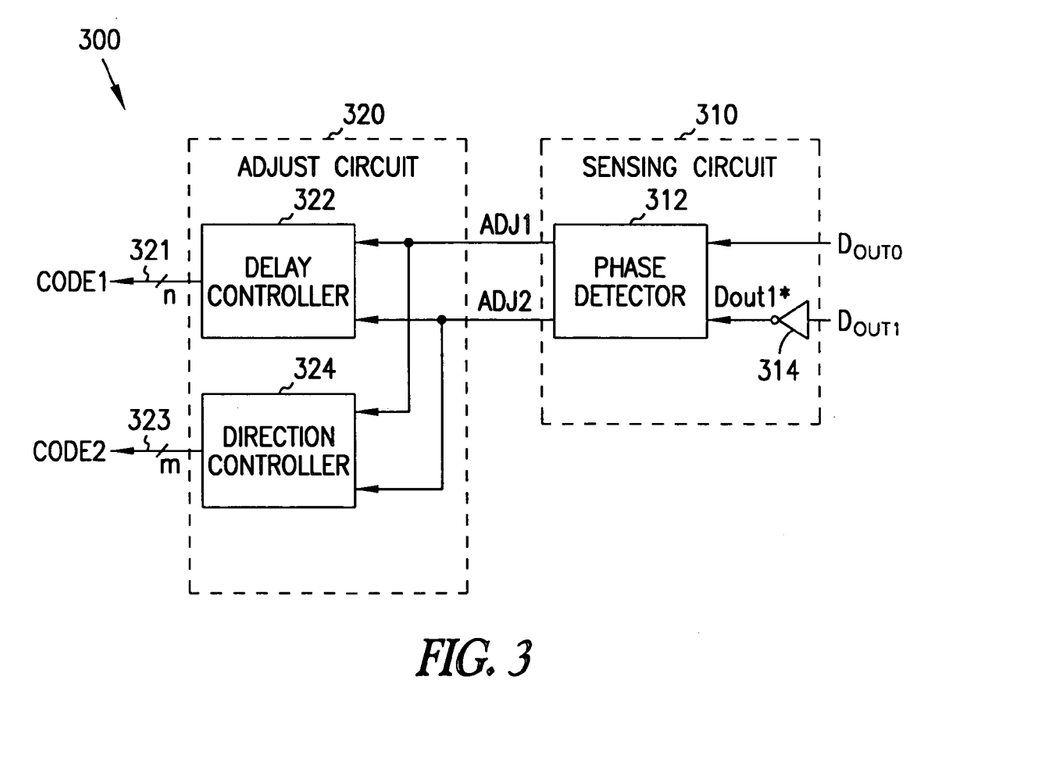
FIG. 3 shows a control loop circuit according to embodiments of the invention.

FIG. 3 shows a control loop circuit according to embodiments of the invention. In some embodiments, control loop circuit 300 may substitute control loop circuit 120 of FIG. 1. In FIG. 3, control loop circuit 300 includes a sensing circuit 310 and an adjust circuit 320. Sensing circuit 310 measures the timing relationship between the $D_{OUT0}$ and $D_{OUT1}$ signals to control adjust signals ADJ1 and ADJ2. Adjust circuit 320 responds to the ADJ1 and ADJ2 signals to control two different codes: a delay code (CODE1) and a direction code (CODE2). CODE1 represents a combination of the signals (bits) on lines 321. CODE2 presents a combination of the signals (bits) on lines 323. Label "n" on lines 321 indicates the number of signals on lines 321. Label "m" on lines 321 indicates the number of signals on lines 321.

The value of CODE1 corresponds to an amount of delay applied to a signal path to adjust the timing of an edge of a signal. The value of CODE2 indicates the direction of delay, which may be either a delay of the rising edge or a delay of the falling edge of the signal. Control loop circuit 300 changes the values of CODE1 and CODE2 to choose appropriate amount of delay and the direction of delay.

Control loop circuit 300 changes the value of the CODE1 by asserting different combinations of the signals on lines 321. Each value of the CODE1 corresponds to an amount of delay. For example, one value of the CODE1 may correspond to one amount of the delay and another value of the CODE1 may correspond to another amount of delay.

Control loop circuit 300 changes the value of the CODE2 by asserting a different combination of the signals on lines 323. Each value of the CODE2 indicates a corresponding direction of delay. For example, one value of the CODE2 may correspond to the delay of the rising edge and another value of the CODE2 may correspond to the delay of the falling edge.

Sensing circuit 310 includes a phase detector 312 to compare the timing of the edges of the $D_{OUT0}$ and $D_{OUT1*}$ signals. The $D_{OUT1*}$ signal is an inversion of the $D_{OUT1}$ signal. An inverter 314 inverts the $D_{OUT1}$ signal to produce the $D_{OUT1*}$ signal.

In some embodiments, phase detector 312 may include a number of sensors or comparators to sense the $D_{OUT0}$ and $D_{OUT1*}$ signals. For example, a first comparator may use a reference signal to sense the $D_{OUT0}$ signal. A second comparator may use the same Reference Signal to sense the $D_{OUT1*}$ signal.

Phase detector 312 compares the rising edges of the $D_{OUT0}$ and $D_{OUT1*}$ signals or the falling edges of the $D_{OUT0}$ and $D_{OUT1*}$ signals and activates the ADJ1 or ADJ2 signal based on the comparison result. For example, phase detector 312 may activate the ADJ1 signal when the rising edge of the $D_{OUT0}$ signal leads the rising edge of the $D_{OUT1*}$ signal. As another example, phase detector may activate the ADJ2 signal when the rising edge of the $D_{OUT0}$ signal lags the rising edge of the $D_{OUT1*}$ signal. In some embodiments, when the ADJ1 signal is activated, the ADJ2 signal is deactivated; and when the ADJ2 signal is activated, the ADJ1 signal is deactivated.

Adjust circuit 320 includes a delay controller 322 and a direction controller 324. Delay controller 322 responds to the ADJ1 and ADJ2 signals to change the value of the CODE1. For example, delay controller 322 may increase the value of the CODE1 when the ADJ1 signal is activated and decrease the value of the CODE1 when the ADJ2 signal is activated. In some embodiments, delay controller 322 includes a state machine with an up/down counter responsive to the ADJ1 and ADJ2 signals to increase or decrease a count value, in which the count value corresponds the value of the CODE1.

Direction controller 324 responds to the ADJ1 and ADJ2 signals to adjust the value of the CODE2. For example, direction controller 324 may increase the value of the CODE2 when the ADJ1 signal is activated and decrease the value of the CODE2 when the ADJ2 signal is activated. In some embodiments, direction controller 324 includes a state machine responsive to the ADJ1 and ADJ2 signals to increase or decrease the value of the CODE2.

The value of CODE1 corresponds to an amount of delay applied to a signal path while an edge is adjusted. The value of CODE2 indicates the direction of delay, which may be either a delay of the rising edge or a delay of the falling edge. Control loop circuit 300 changes the values of CODE1 and CODE2 to choose appropriate amount of delay and the direction of delay.

The combination of the CODE1 and CODE2 may present the CODE of FIG. 1. As described in FIG. 1, the CODE of FIG. 1 is used by output circuits 110 and 111 to control the timing of the $D_{OUT0}$ and $D_{OUT1}$ signals FIG. 1. The CODE1 and CODE2 of FIG. 3 may also be used by output circuits such as output circuit 110 and 111 to control the timing of the $D_{OUT0}$ and $D_{OUT1}$ of FIG. 1.

Figure 4:
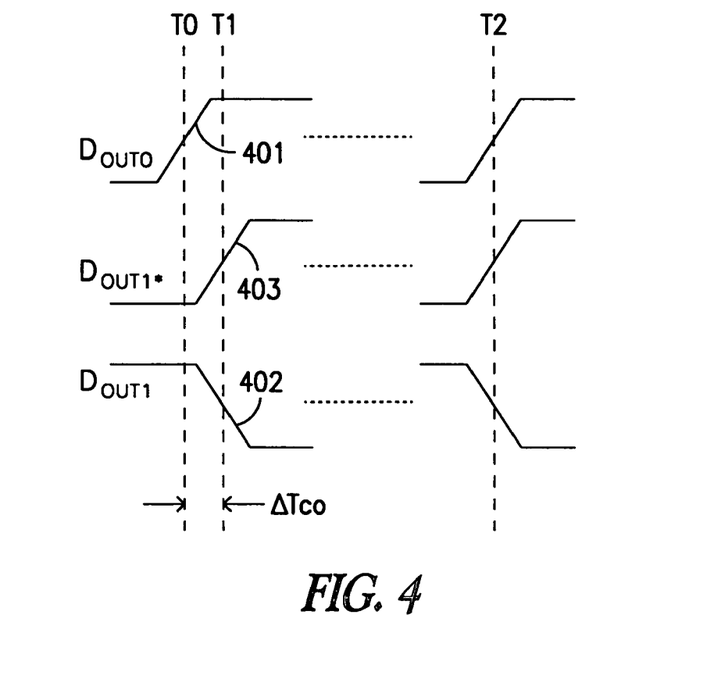
FIG. 4 shows a first example of various signals of FIG. 3.

FIG. 4 shows a first example of various signals of FIG. 3. In FIG. 4, a rising edge 401 of the $D_{OUT0}$ signal leads a falling edge 402 of the $D_{OUT1}$ signal by a delta Tco, which indicates a mismatch between rising edge 401 and falling edge 402. When the mismatch occurs or when delta Tco exists, control loop circuit 300 of FIG. 3 operates to adjust the edges of the $D_{OUT0}$ and $D_{OUT1}$ signal to reduce or eliminate delta Tco.

In some embodiments, control loop circuit 300 adjusts the edges by keeping one edge fixed and adjusting the other edge until both edges match. For example, control loop circuit 300 may keep falling edge 402 fixed and adjust rising edge 401. In some embodiments, control circuit 300 adjusts an edge of a signal by applying a delay to a signal path of the signal. For example, control loop circuit 300 adjusts rising edge 401 by applying an amount of delay to signal path 131 of FIG. 1.

In FIG. 4, since rising edge 403 is an inversion of falling edge 402, comparing rising edge 403 with rising edge 401 is comparable to comparing falling edge 402 with rising edge 401. When a mismatch between rising edges 401 and 403 occurs, phase detector 312 activates the ADJ1 or ADJ2 signal. Direction controller 324 responds to the ADJ1 and ADJ2 signal to select the value for the CODE2 to choose the direction of the delay. Control loop circuit 300 may be configured to adjust the rising edge and keep the falling edge fixed in the case when the rising edge leads the falling edge. Thus, in the example of FIG. 4, direction controller 324 selects an appropriate value of the CODE2 to indicate that the direction of delay in this case is the delay of the rising edge (edge 401).

Delay controller 322 also responds to the ADJ1 and ADJ2 signal to select the value of the CODE1 to adjust the amount of delay applied to the edge chosen by the value of the CODE2. In the example of FIG. 4, delay controller 322 adjusts the value of CODE1 to adjust the amount of delay applied to rising edge 401 to reduce delta Tco. For example, between times T1 and T2, delay controller 322 adjusts the value of the CODE1 to delay rising edge 401 until delta Tco reduces to zero at time T2.

Figure 5:
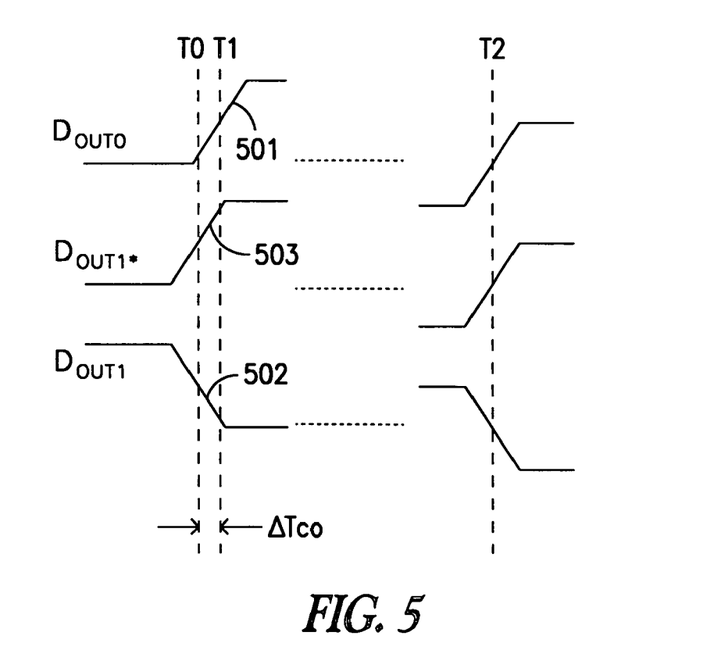
FIG. 5 shows a second example of various signals of FIG. 3.

FIG. 5 shows a second example of various signals of FIG. 3. In FIG. 5, a rising edge 501 of the $D_{OUT0}$ signal lags a falling edge 502 of the $D_{OUT1}$ signal by a delta Tco, which indicates a mismatch between rising edge 501 and falling edge 502. Similarly to the example of FIG. 4, control loop circuit 300 of FIG. 3 also adjusts the values of CODE1 and CODE2 to match the timing of rising edge 501 with the timing falling edge 502.

Control loop circuit 300 may be configured to adjust the falling edge and keep the rising edge fixed in the case when the rising edge lags the falling edge. In FIG. 5 since rising edge 501 lags falling edge 502, direction controller 324 of FIG. 3 may select an appropriate value of the CODE2 to indicate that the direction of delay in this case is the delay of the falling edge. Delay controller 322 also selects the value of the CODE1 to adjust the amount of delay applied to the edge chosen by the value of the CODE2. In the example of FIG. 5, delay controller 322 adjusts the value of CODE1 to adjust the amount of delay applied to falling edge 502 to reduce delta Tco. For example, between times T1 and T2, delay controller 322 adjusts the value of the CODE1 to delay falling edge 502. At time T2, delta Tco reduces to zero.

Figure 6:
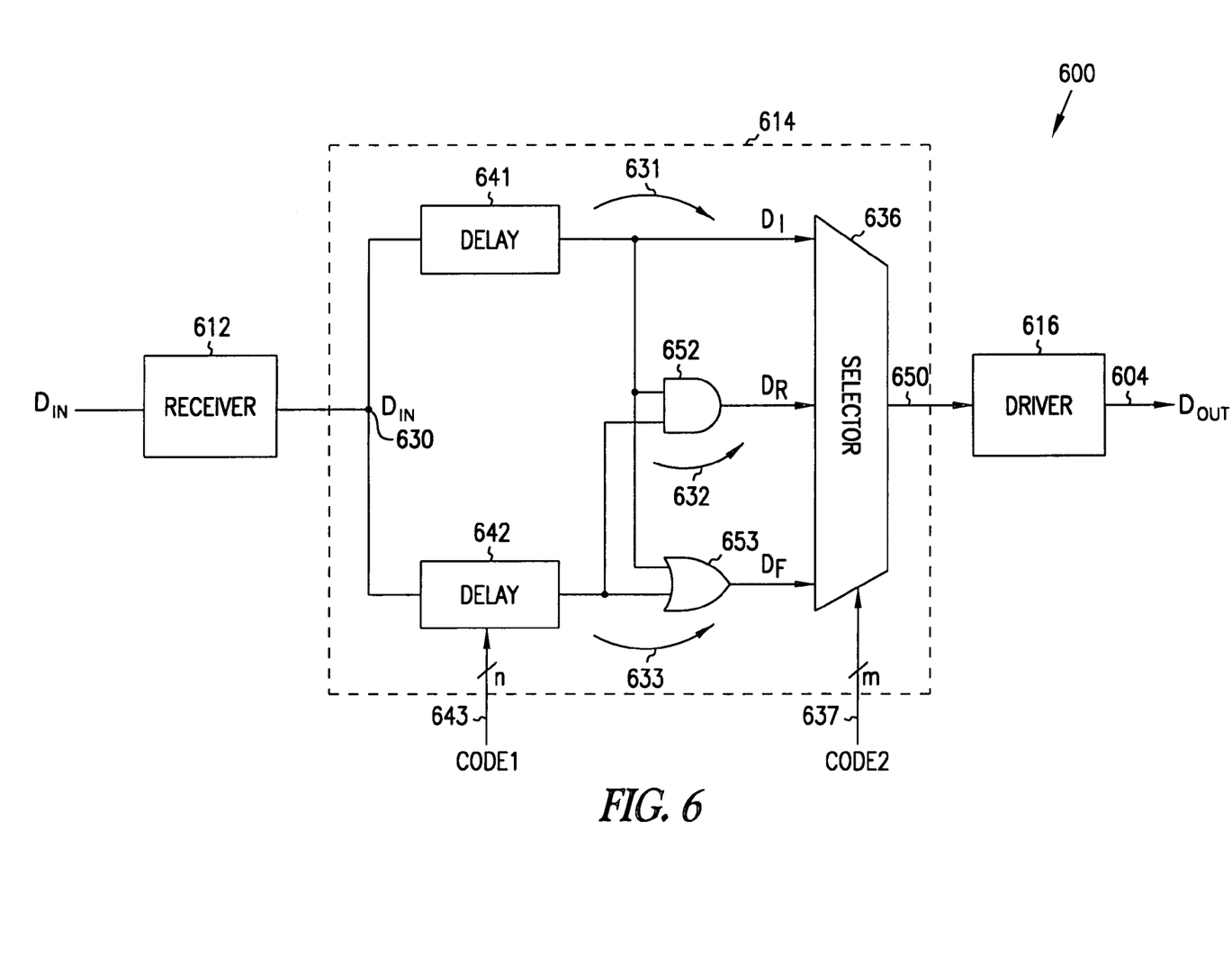
FIG. 6 shows an output circuit according to embodiments of the invention.

FIG. 6 shows an output circuit according to embodiments of the invention. Output circuit 600 may substitute output circuit 110 or 111 of FIG. 1. In FIG. 6, output circuit 600 includes a receiver 612, a signal adjuster 614, and a driver 616. Output circuit 600 receives an input signal $D_{IN}$ and outputs and output signal $D_{OUT}$. The $D_{IN}$ and $D_{OUT}$ signals in FIG. 6 represent the $D_{IN0}$ (or $D_{IN1}$) signal and the $D_{OUT0}$ (or $D_{OUT1}$) signal of FIG. 1 through FIG. 5.

Output circuit 600 of FIG. 6 uses two codes (CODE1 and CODE2) to control the timing of the $D_{OUT}$ signal. The CODE1 and CODE2 are provided by a control loop circuit such as control loop circuit 300 of FIG. 3.

Receiver 612 receives the $D_{IN}$ signal and passes the $D_{IN}$ to node 630. From node 630, the $D_{IN}$ signal propagates through three different signal paths 631, 632, and 633 within adjuster 614. Signal paths 631, 632, and 633 have different adjustments to the $D_{IN}$ signal to produce three different signals $D_I$, $D_R$, and $D_F$. Signal adjuster 614 selects one of the $D_I$, $D_R$, and $D_F$ signals and passes the selected signal to node 650. Driver 616 responds to the signal from node 650 to drive the $D_{OUT}$ signal.

Signal adjuster 614 includes delay units 641 and 642, AND gate 652, OR gate 653, and a selector 636. Delay unit 642 and AND gate 652 form a first edge adjuster to adjust the rising edge of the $D_{IN}$ signal on signal path 632. Delay unit 642 and OR gate 653 form a second edge adjuster adjust the falling edge of the DIN signal on signal path 633.

Each of the delay units 641 and 642 is set to apply an amount of delay to a corresponding signal path. In some embodiments, delay unit 641 may be set by a programming or configuring sequence. Delay unit 642 is set by the value of CODE1.

In some embodiments, delay unit 641 may be set to apply a first an amount of delay on signal path 613; and delay unit 642 may be set to apply a second an amount of delay on each of the signal paths 622 and 633. The amount of delay applied by each of the delay units 641 and 642 is referred to as adjustment delay.

In FIG. 6, delay unit 614 is set such that no delay or an insignificant amount of delay is introduced to the $D_{IN}$ signal on signal path 613. Delay unit 642 is set to apply an equal amount of delay to signal paths 632 and 633. However, the amount of delay from delay unit 642 causes different affects on the signals on signal paths 632 and 633. On signal path 632, the amount of delay affects the timing of the rising edge of the signal. On signal path 633, the amount of delay affects the timing of the falling edge of the signal.

In FIG. 6, when delay 641 applies no delay to signal path 631, the $D_1$ signal represents the $D_{IN}$ signal in which no delay is applied to the rising or falling edge of the $D_{IN}$ signal. Thus the duty cycle of the $D_{IN}$ signal remains unchanged.

The $D_R$ signal represents the $D_{IN}$ signal in which the rising edge of the $D_R$ signal is the rising edge of the $D_{IN}$ signal delayed by an amount set by delay unit 642. Thus, on signal path 632, the duty cycle of the $D_{IN}$ signal is changed.

The $D_F$ signal represents the $D_{IN}$ signal in which the falling edge of the $D_F$ signal is the falling edge of the $D_{IN}$ signal delayed by an amount set by delay unit 642. Thus, on signal path 633, the duty cycle of the $D_{IN}$ signal is changed.

Selector 636 selects one of the $D_I$, $D_R$, and $D_F$ signals and passes the selected signal to node 650. The value of the CODE2 on select control nodes 637 enables selector 636 to make the selection. For example, a first value of the CODE2 signal enables selector 636 to select the $D_I$ signal, a second value of the CODE2 signal enables selector 636 to select the $D_R$ signal, and a third value of the CODE2 signal enables selector 636 to select the $D_F$ signal.

Delay unit 642 is a variable delay unit, which varies the amount of delay applied to signal paths 632 and 633 based on the value of the CODE1 on delay control nodes 643. Different value of the CODE1 causes delay unit 642 to select a different amount of delay.

The value of the CODE1 and CODE2 signals are chosen by a control loop circuit such as control loop circuit 300 of FIG. 3, in which control loop circuit 300 chooses the values of the CODE1 and CODE2 based on the timing of the edges of the $D_{OUT0}$ and $D_{OUT1}$ signals.

The combination of output circuit 600 with a control loop circuit such as control loop circuit 300 modify the values of CODE1 and CODE2 to adjust the timing of the $D_{OUT0}$ and $D_{OUT1}$ signals.

Figure 7:
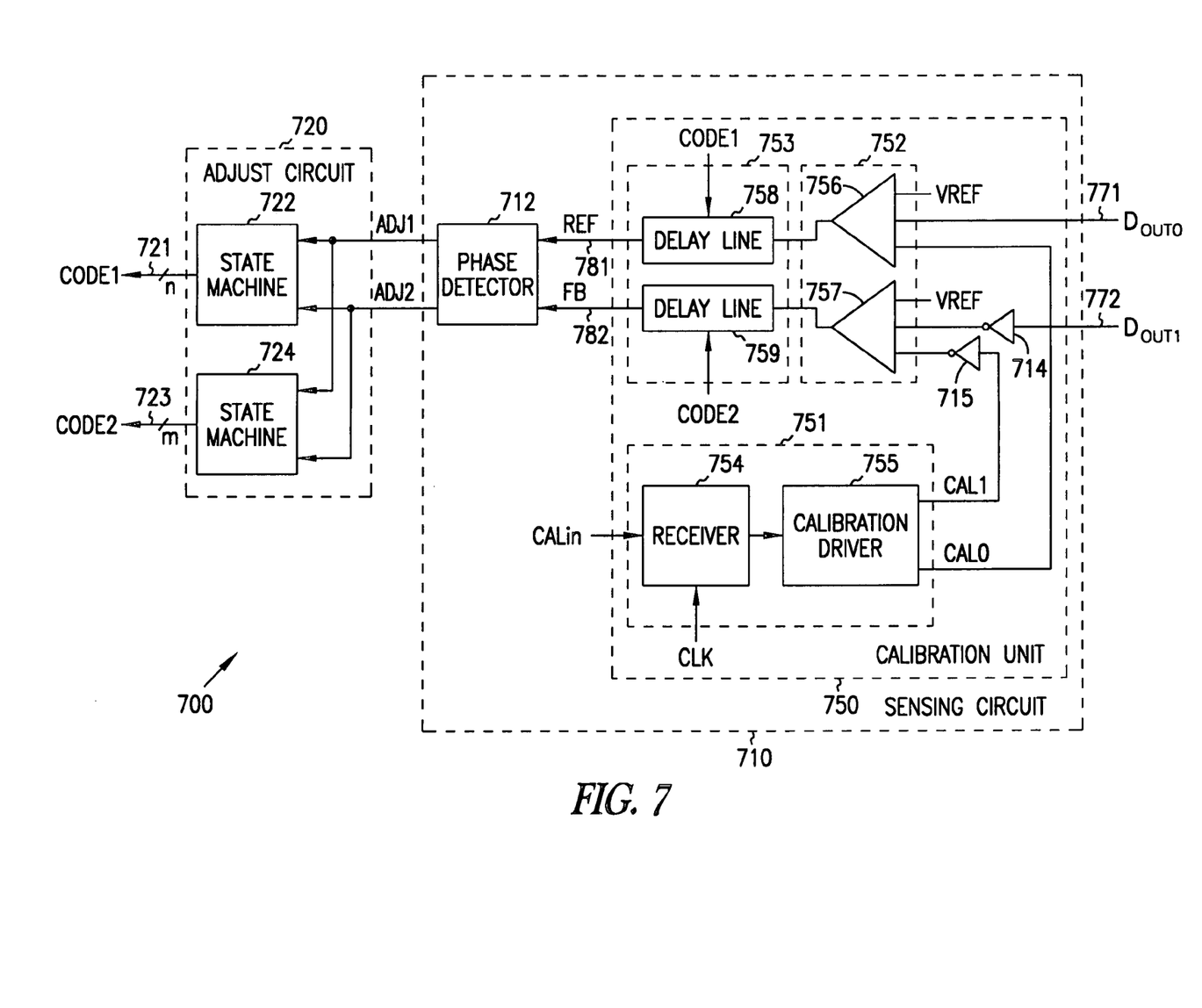
FIG. 7 shows a control loop circuit having a calibrating unit according to embodiments of the invention.

FIG. 7 shows a control loop circuit having a calibrating unit according to embodiments of the invention. In some embodiments, control loop circuit 700 may substitute control loop circuit 120 of FIG. 1. In FIG. 7, control loop circuit 700 includes a sensing circuit 710 and an adjust circuit 720. Sensing circuit 710 measures the timing relationship between the REF and FB signals to control adjust signals ADJ1 and ADJ2. Adjust circuit 720 responds to the ADJ1 and ADJ2 signals to control a delay code (CODE1) and a direction code (CODE2). CODE1 represents a combination of the signals (bits) on lines 721. CODE2 presents a combination of the signals (bits) on lines 723. The number of the signals on lines 721 is indicated by label "n". The number of the signals on lines 721 is indicated by label "m". The CODE1 and CODE2 serve purposes similar to the purposes of the CODE1 and CODE2 of control loop circuit 700 of FIG. 7. The combination of the CODE1 and CODE2 of FIG. 7 presents the CODE of FIG. 1. In some embodiments, the CODE1 and CODE2 of FIG. 7 may be used by output circuits such as output circuit 110 and 111 of FIG. 1 or output circuit 600 of FIG. 6 to control the timing of the $D_{OUT0}$ and $D_{OUT1}$ signals.

Sensing circuit 710 includes a phase detector 712 to compare the timing of the edges of the REF signal at node 781 and the FB signal at node 782. The pad output signal $D_{OUT0}$ at node 771 and the pad output signal $D_{OUT1}$ at node 772 may be the $D_{OUT0}$ and $D_{OUT1}$ signals outputted by output circuits such as output circuits 110 and 111 of FIG. 1 or output circuit 600 of FIG. 6. Phase detector 712 compares the rising edges of the REF and FB signals or the falling edges of the REF and FB signals and activates the ADJ1 or ADJ2 signal based on the comparison result. For example, phase detector 712 may activate the ADJ1 signal when the rising edge of the REF signal leads the rising edge of the FB signal. As another example, phase detector may activate the ADJ2 signal when the rising edge of the REF signal lags the rising edge of the FB signal.

Adjust circuit 720 includes a first state machine 722 and a second state machine 724. State machine 722 serves a purpose similar to the purpose of delay controller 322 of FIG. 3. State machine 724 serves a purpose similar to the purpose of direction controller 324. State machine 722 responds to the ADJ1 and ADJ2 signals to change the value of the CODE1. In some embodiments, state machine 722 includes an up/down counter responsive to the ADJ1 and ADJ2 signals to increase or decrease a count value, in which the count value corresponds the value of the CODE 1. State machine 724 responds to the ADJ1 and ADJ2 signals to adjust a value of the CODE2. In some embodiments, state machine 724 includes a state machine responsive to the ADJ1 and ADJ2 signals to increase or decrease the value of the CODE2.

Sensing circuit 710 further includes a calibration unit 750. Calibration unit 750 includes a calibration output circuit 751, a compare circuit 752, and a calibration delay circuit 753. Calibration output circuit 751 includes a receiver 754 to receive a calibration input signal CALin and a clock signal CLK, and a calibration driver 755 to drive two calibration output signals CAL0 and CAL1. Compare circuit 752 includes a comparator 756 and 757. Comparator 756 has input nodes to receive a reference signal Vref, the $D_{OUT0}$ signal, and the CAL0 signal. Comparator 757 has input nodes to receive the Vref, $D_{OUT1}$, and CAL1 signals. Calibration delay circuit 753 has delay lines 758 and 759. Delay line 758 applies a calibrating delay (time delay) to a signal from the output of comparator 756. Delay line 759 applies a calibrating delay to a signal from the output of comparator 757. Both delay lines 758 and 759 have control nodes connected to lines 721 of state machine 722 to receive the delay code CODE1.

In some cases, a mismatch in propagation delay may occur due to variations in factors such as manufacturing process and other factors. For example, inverter 714 may introduce a delay to a feedback path between nodes 772 and 782, thereby causing the propagation delay on the feedback path between nodes 772 and 782 to be mismatched with the propagation delay on a feedback path between nodes 771 and 781.

Calibration unit 750 reduces a mismatch in the propagation delay among the paths leading to phase detector 712 to improve the adjustment of the mismatch between clock-to-pad delay (TcoR or TcoF) of the $D_{OUT0}$ and $D_{OUT1}$ signals.

In some embodiments, each of the comparators 756 and 757 includes a selector, a switch, or a multiplexer to select between a calibrating signal and a pad output signal at different times. For example, comparators 756 and 757 may include a selector to select the CAL0 and CAL1 signals in a calibration sequence and to select the $D_{OUT0}$ and $D_{OUT1}$ signals in a clock-to-pad adjustment sequence.

Calibration unit 750 may be configured to reduce the propagation delay among the signal paths of control loop circuit 700 in the calibration sequence. During the calibration sequence, calibration driver 755 drives out the CAL0 and CAL1 signals such that a rising edge of the CAL0 signal is aligned with a falling edge of the CAL1 signal. The CAL0 and CAL1 signals may be generated from the CALin signal. Comparators 756 and 757 uses the Vref signal to sense the CAL0 and CAL1 signals and provides the sensed signals to phase detector 712 as the REF and FB signals.

Phase detector 712 compares the REF and FB signals, which represent the CAL0 signal and an inversion of CAL1 signal. Phase detector 712 activates the ADJ1 or ADJ2 signal based on the comparison result. State machine 722 responds to the ADJ1 and ADJ2 signals, adjusts the value of the CODE1. The value of the CODE1 adjusts the amount of the delay applied by delay lines 758 and 759 to the REF and FB signals. When the edges of the REF and FB signals are aligned, phase detector 712 controls the ADJ1 and ADJ2 signals such that state machine 722 stops adjusting the value of the CODE1 and hold the value of the CODE1 at a calibrated value. Consequently, delay lines 758 and 759 also stops adjusting the amount of delay and holds the amount of delay at the amount corresponding to the calibrated value of the CODE1.

In some embodiments, calibration unit 750 is deactivated after the calibration sequence. In some embodiments, control loop circuit 700 is configured to begin the Tco adjustment sequence after a calibration sequence to adjust any mismatch between clock-to-pad delay (TcoR or TcoF) of the $D_{OUT0}$ and $D_{OUT1}$ signals.

Figure 8:
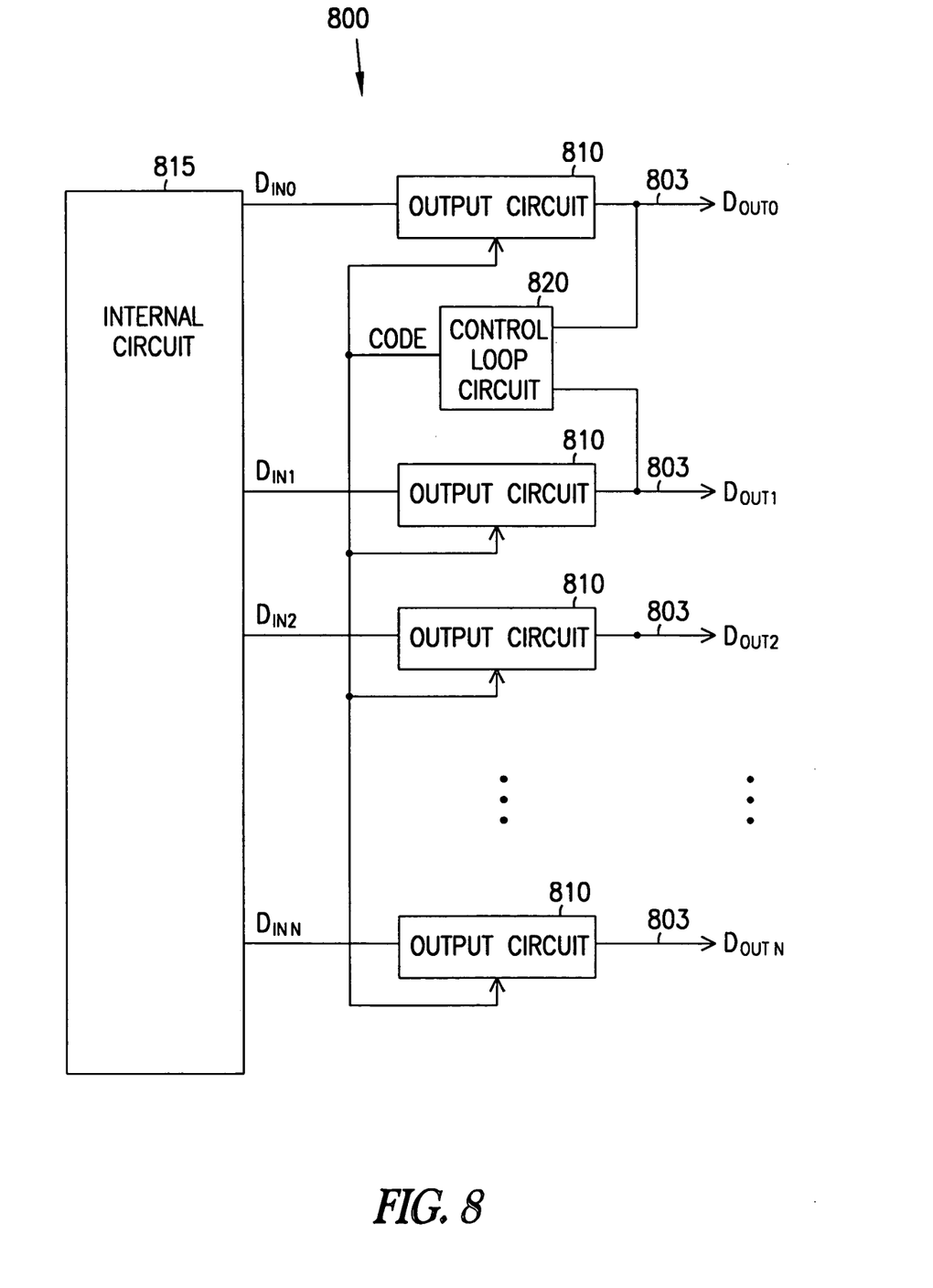
FIG. 8 shows an integrated circuit having multiple output circuits and a control loop circuit according to embodiments of the invention.

FIG. 8 shows an integrated circuit having multiple output circuits and a control loop circuit according to embodiments of the invention. Integrated circuit 800 includes a number of output circuits 810. Each output circuit 810 receives one of the input signals $D_{IN0}$, $D_{IN1}$ through $D_{INN}$ signals and outputs one of the output signals REF, $D_{OUT1}$ through $D_{OUTN}$ signals. Each output circuit 810 also receives a control code CODE. The $D_{IN0}$, $D_{IN1}$ through $D_{INN}$ signals are generated by an internal circuit 815. The REF, $D_{OUT1}$ through $D_{OUTN}$ signals are provided to terminals 803.

Integrated circuit 800 also includes a control loop circuit 820 to adjust the mismatch between the clock-to-pad delay of the $D_{OUT1}$ through $D_{OUTN}$ signals. Output circuits 810 include embodiments of the output circuit of FIG. 1 and FIG. 6. Control loop circuit 820 of FIG. 8 includes embodiments of the control loop circuit of FIG. 1, FIG. 3, and FIG. 7. The CODE in FIG. 8 represents the CODE of FIG. 1 and may include a combination of different codes such as the CODE1 and CODE2 of FIG. 3 and FIG. 7.

In some embodiments, integrated circuit 800 has an adjustment sequence, in which control loop circuit 820 adjusts the timing of the $D_{OUT0}$ through $D_{OUTN}$ signals such as the timing represented by TcoR, TcoF, or any combination thereof. The values of the control codes such as CODE1 and CODE2 are obtained after delta Tco is reduced. In some embodiments, control loop circuit 820 may be deactivated after the adjustment sequence such that the values of the control codes such as CODE, CODE1, and CODE2 applied to output circuits 810 are fixed. In other embodiments, control loop circuit 820 may remain active after the adjustment sequence to continue to adjust the values of the control codes when appropriate.

Figure 9:
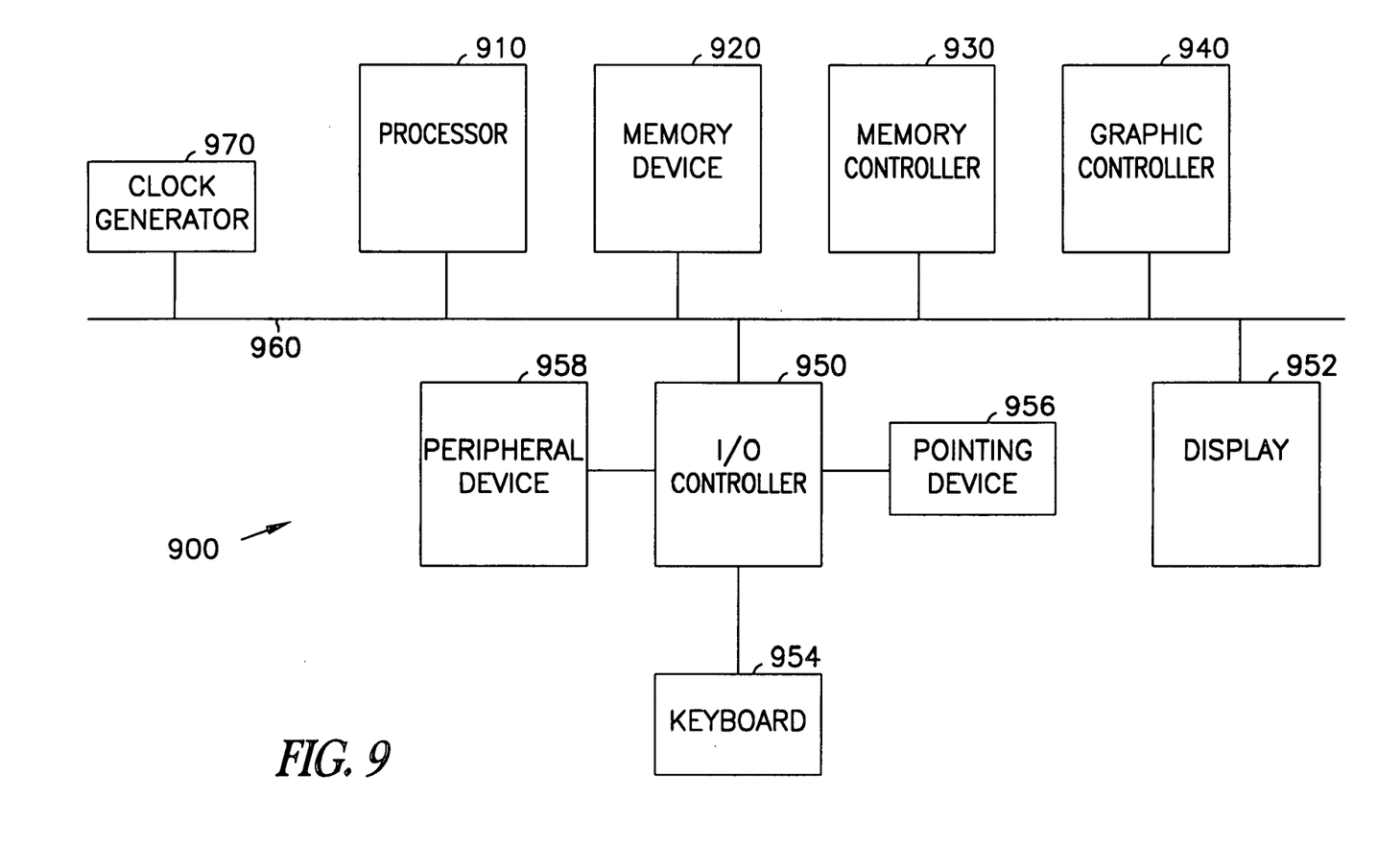
FIG. 9 shows a system according to embodiments of the invention.

FIG. 9 shows a system according to embodiments of the invention. System 900 includes a processor 910, a memory device 920, a memory controller 930, a graphic controller 940, an input and output (I/O) controller 950, a display 952, a keyboard 954, a pointing device 956, and a peripheral device 958. A bus 960 connects all of these devices together. A clock generator 970 provides an external clock signal to at least one of the devices of system 900. Two or more devices shown in system 900 may be formed in a single chip. In some embodiments, system 900 may omit one or more devices shown in FIG. 9.

Bus 960 may be conducting traces on a circuit board or may be one or more cables. Bus 960 may also connect the devices of system 900 by wireless means such as electromagnetic radiation (e.g., radio waves). Peripheral device 958 may be a printer, an optical device (e.g., a CD-ROM device or a DVD device), a magnetic device (e.g., floppy disk driver), or an audio device (e.g., a microphone). Memory device 920 may be a dynamic random access memory (DRAM) device, or a static random access memory (SRAM) device, or a flash memory device or any combination thereof.

At least one of the devices shown in system 900 includes an embodiment of integrated circuit 800 of FIG. 8, in which integrated circuit 800 may include embodiments of FIG. 1 through FIG. 7. Thus, at least one of the devices shown in system 900 includes a number of output circuits and a control loop circuit, such as output circuits and a control loop circuit described in FIG. 1 through FIG. 8 in which the control loop circuit serves as a feedback loop to reduce the clock-to-pad delay of the signals at the output nodes or output terminals.

System 900 of FIG. 9 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

Figure 10:
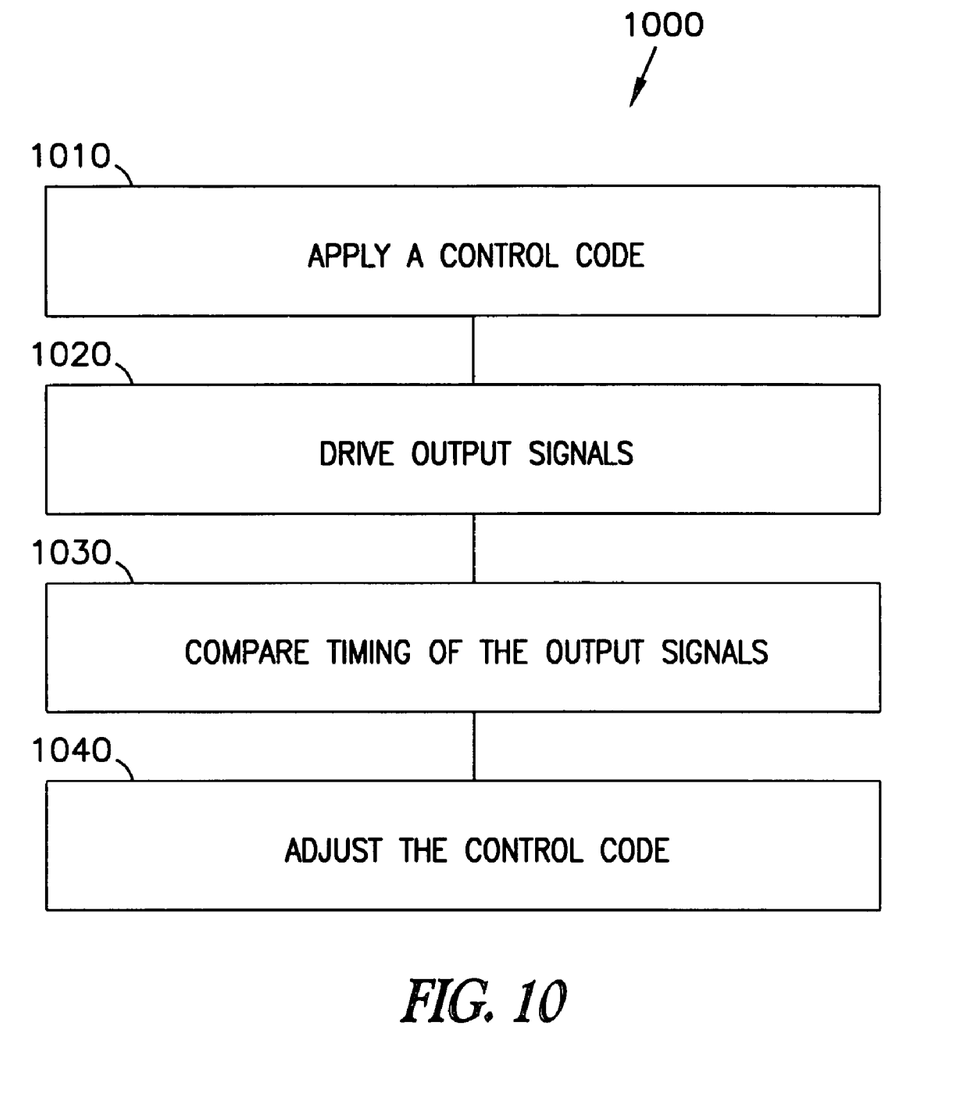
FIG. 10 is a flowchart of a method of adjusting timing of output signals according to embodiments of the invention.

FIG. 10 shows a flowchart of a method of adjusting timing of output signals according to embodiments of the invention. Method 1000 may be used to adjust the output signals of FIG. 1 though FIG. 9.

Box 1010 applies a control code. The control code may be the CODE1, or CODE1 and CODE2 described in FIG. 1 through FIG. 9. Box 1010 applies the control code to signal paths of a number of output circuits including a first output circuit and a second output circuit. The output circuits may include embodiments of output circuits described in FIG. 1 through FIG. 9.

Box 1020 drives a number of output signals. The output signals include a first output signal at an output node of the first output circuit, and a second output signal at an output node of the second output circuit. The first and second output signals may be the $D_{OUT0}$ and $D_{OUT1}$ signals described in FIG. 1 through FIG. 9. The first signal may be an inversion of the second output signal. The action in box 1020 may be performed by output circuits such as the output circuits described in FIG. 1 through FIG. 9.

Box 1030 compares timing of the output signals. In some embodiments, box 1030 compares the timing relationship between edges of the first and second output signals. The timing relationship includes a clock-to-pad delay timing such as the TcoR and TcoF described in FIG. 1 through FIG. 9. The action in box 1030 may be performed by control loop circuits such as control loop circuits described in FIG. 1 through FIG. 9.

Box 1040 adjusts the control code. In response to the comparison in box 1030, box 1040 adjusts the control code to reduce or eliminate any mismatch in the timing of the output signals. In some embodiments, box 1040 adjusts the control code to modify the duty cycle of the signals on signal paths of the first and second output circuits. In other embodiments, box 1040 adjusts the control code to modify a propagation delay on at least one feedback path of the output signals. The action in box 1030 may be performed by control loop circuits such as control loop circuits described in FIG. 1 through FIG. 9.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An integrated circuit comprising:
   a number of output circuits to output a number of output signals, each of the output circuits including an input node, an output node, and a signal duty cycle adjuster coupled between the input and output nodes, the signal duty cycle adjuster including a number of first control nodes to receive a first control code, and a number of second control nodes to receive a second control code; and
   a control loop circuit coupled to the signal duty cycle adjuster to adjust the first and second control codes based on the output signals, wherein the control loop circuit includes:
      a phase detector coupled to a number of selected output nodes among the output nodes of the output circuits; and
      a first state machine responsive to the phase detector to modify the first control code; and
      a second state machine responsive to the phase detector to modify the second control code.

2. The integrated circuit of claim 1, wherein the signal duty cycle adjuster includes:
   a variable delay unit coupled in a signal path between the input and output nodes of one of the output circuits, the variable delay unit having delay control nodes coupled to the first state machine; and
   a selector coupled to the signal path and including select control nodes coupled to the second state machine.

3. The integrated circuit of claim 1, wherein the control loop circuit further includes calibration unit coupled to the phase detector to adjust a propagation delay on a path between each of the selected output nodes and the phase detector.

4. The integrated circuit of claim 1, wherein the control loop circuit further includes a compare circuit having at least one input node coupled to the output node of at least one of the output circuits, and at least one output node coupled to the phase detector.

5. The integrated circuit of claim 4, wherein the control loop circuit further includes a calibration delay circuit responsive to the first state machine to adjust a delay on a number of feedback paths between the phase detector and the selected output nodes.

6. A device comprising:
a first output circuit having a first input node, a first output node, a first signal path between the first input node and the first output node to pass a first input signal from the first input node to the first output node, and a first signal adjuster on the first signal path to receive a control code;
a second output circuit having a second input node, a second output node, a second signal path between the second input node and the second output node to pass a second input signal from the second input node to the second output node, and a second signal adjuster on the second signal path to receive the control code, wherein at least one of the first and second output circuits includes a node to receive a clock signal different from one of the first and second input signals;
a sensing circuit coupled to the first and second output nodes to compare a timing relationship between an output signal at the first output node and an output signal at the second output node; and
an adjust circuit responsive to the sensing circuit to modify the control code.

7. The device of claim 1, wherein at least one of the first and second signal adjusters includes a number of control nodes to receive the control code.

8. The device of claim 6, wherein the signal adjuster of the first output circuit includes:
a first edge adjuster coupled between the first input node and the first output node to adjust a timing of a first edge of the first input signal; and
a second edge adjuster coupled between the first input node and the first output node to adjust a timing of a second edge of the first input signal.

9. The device of claim 8, wherein the sensing circuit includes:
a comparator coupled to the first output node; and
a phase detector coupled to the comparator and the adjust circuit.

10. The device of claim 9, wherein the signal adjuster of the second output circuit includes:
a first edge adjuster coupled between the second input node and the second output node to adjust a timing of a first edge of the second input signal; and
a second edge adjuster coupled between the second input node and the second output node to adjust a timing of a second edge of the second input signal.

11. The device of claim 6, wherein the sensing circuit includes a phase detector having a number of output nodes, a first input node coupled to the first output node via a first feedback path, and a second input node coupled to the second output node via a second feedback path.

12. The device of claim 11, wherein the adjust circuit includes at least one state machine coupled to the output nodes of the phase detector to modify the control code.

13. The device of claim 11, wherein the sensing circuit further includes a calibration unit coupled to the first and second feedback paths to adjust a propagation delay on each of the first and second feedback paths.

14. A system comprising:
a first integrated circuit; and
a second integrated circuit coupled to the first integrated circuit, the second integrated circuit including:
a number of terminals;
a number of output circuits coupled to the terminals to provide a number of output signals, each of the output circuits including an input node, an output node, a signal path between the input node and the output node to pass a signal from the input node to the output node as one of the output signals, and a signal adjuster between the input and output nodes to receive a first binary control code and a second binary control code to adjust a duty cycle of each of the output signals;
a phase detector coupled to the terminals; and
an adjust circuit responsive to the phase detector to adjust the first and second binary control codes.

15. The system of claim 14, wherein the adjust circuit includes:
a first state machine coupled between the phase detector and the signal adjuster; and
a second state machine coupled between the phase detector and the signal adjuster.

16. The system of claim 15, wherein the signal adjuster includes:
a variable delay unit coupled to the input node and the output node of one of the output circuits, the variable delay unit having delay control nodes coupled the first state machine; and
a selector coupled to the variable delay unit and including select control nodes coupled to the second state machine.

17. The system of claim 15 further comprising a calibration unit configured to adjust a delay of at least one feedback path between the phase detector and the terminals.

18. A method comprising:
applying a control code to a first signal path and a second signal path;
driving a first input signal on the first signal path to provide a first output signal at a first output node of the first signal path, wherein driving the first input signal includes receiving a clock signal for use as a timing signal for the first input signal;
driving a second input signal on the second signal path to provide a second output signal at a second output node of the second signal path;
comparing a timing relationship between the first and second output signals; and
adjusting the control code based on the comparison.

19. The method of claim 18, wherein applying the control code includes applying a delay code to each of the first and second signal paths in which the delay code corresponds to an adjustment delay applied to each of the first and second signal paths.

20. The method of claim 19, wherein applying the control code further includes applying a direction code to each of the first and second signals path in which the direction code indicates a delay of one of a rising edge and a falling edge of each of the first and second input signals.

21. The method of claim 20, wherein adjusting the control code includes adjusting at least one of the delay code and the direction code.

22. The method of claim 18, wherein comparing includes comparing an edge of the first output signal with an edge of the second output signal.

23. The method of claim 18, wherein adjusting the control code includes adjusting a duty cycle of each of the first and second input signals.

24. The method of claim 18, wherein the first output signal in an inversion of the second output signal.

25. The method of claim 18, wherein comparing includes propagating the first output signal on a first feedback path and propagating the second output signal on a second feedback path.

26. The method of claim 25 further comprising:
adjusting a calibrating delay applied to the first feedback path; and
adjusting a calibrating delay applied to the second feedback path.

27. The method of claim 26, wherein adjusting the calibrating delay applied the to first and second feedback paths is performed in a calibrating sequence, and wherein propagating the first and second output signals is performed in an adjustment sequence separated from the calibrating sequence.

28. An integrated circuit comprising:
a number of output circuits to output a number of output signals, each of the output circuits including an input node, an output node, a signal path between the input node and the output node to pass a signal from the input node to the output node as one of the output signals, and a signal duty cycle adjuster coupled between the input and output nodes, the signal duty cycle adjuster including a number of first control nodes to receive a first control code, and a number of second control nodes to receive a second control code; and
a control loop circuit coupled to the signal duty cycle adjuster to adjust the first and second control codes based on a comparison of a timing relationship between the output signals.

* * * * *